United States Patent [19]

Kameyama et al.

[11] Patent Number: 4,764,897
[45] Date of Patent: Aug. 16, 1988

[54] SEMICONDUCTOR MEMORY DEVICE EMPLOYING NORMALLY-ON TYPE GAAS-MESFET TRANSFER GATES

[75] Inventors: Atushi Kameyama, Kanagawa; Yasuo Ikawa, Tokyo; Katsue Kawakyu, Kawasaki, all of Japan

[73] Assignee: Kabushiki Kaisha Toshiba, Kawasaki, Japan

[21] Appl. No.: 906,250

[22] Filed: Sep. 12, 1986

[30] Foreign Application Priority Data

Sep. 30, 1985 [JP] Japan .................................. 60-216434

[51] Int. Cl.$^4$ .............................................. G11C 11/00
[52] U.S. Cl. ..................................... 365/154; 365/190; 307/279
[58] Field of Search ............... 365/154, 190, 174, 203; 307/279

[56] References Cited

U.S. PATENT DOCUMENTS 4,438,351  3/1984  Schuermeyer ................... 307/279 X
4,665,508  5/1987  Chang ............................. 365/190 X

OTHER PUBLICATIONS

Technical Digest, 1984 GaAs IC Symposium, p. 121, "Processing Technologies for GaAs Memory LSIs"; Y. Ishii et al; Oct. 1984.
Technical Digest, 1984 GaAs IC Symposium, p. 117 "A GaAs 4K Bit Static RAM with Normally-on and -off Combination Circuit".
Technical Digest, 1983 GaAs IC Symposium p. 74 "Ultra-Low Power, High Speed GaAs 256-Bit Static RAM", S. J. Lee et al. Oct. 1983.

Primary Examiner—Joseph A. Popek
Attorney, Agent, or Firm—Oblon, Fisher, Spivak, McClelland & Maier

[57] ABSTRACT

A GaAs (gallium arsenide) semiconductor memory device includes a plurality of memory cells connected in a matrix form by employing a plurality of bit lines and of word lines, and of word line drivers. The memory device is operable under a single power supply. Transfer gates of the memory cells are normally-on type GaAs metal-semiconductor field effect transistors (MESFET's). A parallel circuit including a Schottky diode and a switching GaAs-MESFET is interposed between commonly-connected sources of driver MESFET's of each of the memory cells and the ground line, so that a higher potential of the commonly-connected sources is clamped due to the clamping effect of the Schottky diode when the switching GaAs-MESFET is turned off.

8 Claims, 4 Drawing Sheets

SEMICONDUCTOR MEMORY DEVICE EMPLOYING NORMALLY-ON TYPE GAAS-MESFET TRANSFER GATES

BACKGROUND OF THE INVENTION

1. Field of the Invention

The present invention generally relates to a semiconductor memory device employing GaAs MESFET's and, more specifically, to a static random access memory device employing normally-on type MESFET's as its transfer gates.

2. Description of Prior Art

An integrated circuit using a GaAs-MESFET (a gallium arsenide metal-semiconductor field effect transistor) collects the spotlight of attention, since it can operate at a high speed, as compared with the conventional integrated circuit using silicon. A high speed memory device using MESFET's such as, particularly, a buffer memory or a static RAM (random access memory) has been known very recently in this field. Among several circuit arranging methods of the static RAM, a six-transistor cell has been proposed as the most typical device, in which a flip-flop is constituted using a normally-off type MESFET as a driver FET and a normally-on type MESFET as a load. An example of this transistor cell is shown in FIG. 1. In this circuit diagram, FET's Q1 and Q2 are normally-off type MESFET's, and FET's Q3 and Q4 are normally-on type MESFET's, thereby constituting a flip-flop 10. Nodes 12 and 14 of flip-flop 10 are connected to bit lines $BL_1$ and $BL_2$ through a transfer gate made of normally-off type MESFET's Q5 and Q6. Gates of FET's Q5 and Q6 are connected to a word line WL. By arranging a plurality of such a memory cell 20 in a matrix form, a static RAM (not shown in detail) can be fabricated.

The reading and writing operations from and into memory cell 20 are executed by turning on FET's Q5 and Q6 by word line WL, by applying a signal voltage to flip-flop 10, and taking out the signal voltage of flip-flop 10 through bit lines $BL_1$ and $BL_2$.

In the circuit arrangement of memory cell 20, the time (access time) to read out information stored therein depends on the time required to charge and discharge stray capacitances of bit lines $BL_1$ and $BL_2$ through MESFET's Q5 and Q6. Therefore, it is well known that the greater the access time is reduced, the larger the current drivabilities of MESFET's Q5 and Q6 functioning as transfer gates becomes. However, in general, normally-off type MESFET's have their inherent drawbacks such that the parasitic resistance is large. The current drivability "I" is expressed by the following equation.

$$I = k(V_{th} - V_{GS})^2$$

Where, k denotes a constant, $V_{th}$ is a threshold voltage of MESFET, and $V_{GS}$ is a gate-to-source voltage of MESFET. As will be obvious from this equation, the current drivability "I" is proportional to the square of the potential difference of $|V_{th} - V_{GS}|$. Therefore, in general, there are such inherent drawbacks that the current drivability "I" of the normally-off type FET is smaller than that of the normally-on type MESFET.

Since the normally-off type MESFET has such various inherent drawbacks as mentioned above, it tends to use the normally-on type MESFET for a memory device.

As shown in FIG. 2, therefore, the memory arrangement using normally-on type MESFET's Q7 and Q8 as transfer gates has been proposed. In this memory arrangement 30, the transfer gates of normally-on type FET's Q7 and Q8 are connected to the same flip-flop 10 as shown in FIG. 1. The current drivabilities of these transfer gates FET's Q7 and Q8 are larger and their own stray capacitances are smaller than those of the normally-off type FET's, so that the reduction of the access time can be realized.

However, there is a still problem in the above memory arrangement 30. That is, since each gate potential of MESFET's Q7 and Q8 needs to be negative with respect to the respective sources thereof in order to turn off normally-on type MESFET's Q7 and Q8, it is necessary to introduce a word line driver (not shown in detail) to render the potential of word line WL to be negative with respect to the potentials of nodes 12 and 14 in memory cell 30. Unless otherwise, the information already stored in the memory cell cannot be firmly held.

A level shift circuit is required in order not to obstruct the advantages of memory cell 30 using such normally-on type MESFET's as transfer gates. A buffered FET logic circuit is known as a typical example of the conventional level shift circuits. The typical buffered FET logic circuit is disclosed in, for example, "A GaAs 4k BIT STATIC RAM WITH NORMALLY-ON AND -OFF COMBINATION CIRCUIT", Technical Digest, 1984, GaAs IC Symposium, page 117, October 1984, Y. Ikawa et al. To use such a buffered FET logic circuit, two sets of positive and negative power sources $V_{DD}$ and $V_{SS}$ need to be used as a word line driver circuit.

However, the necessity of use of such two sets of positive and negative power sources will cause an unfavorable problem in terms of the arrangement of the memory system.

Therefore, in the semiconductor memory device using GaAs-MESFET's, there is a growing need for realizing such a memory device that a normally-on type GaAs-MESFET with a larger current drivability can be used as a transfer gate and at the same time, the high operating speed as a feature of this memory device is not harmed while being driven by a single power supply.

The present invention is made in consideration of the above-mentioned technical trade off aspects, and it is therefore an object of the invention to provide a semiconductor memory device employing GaAs-MESFET's. In spite of the fact that normally-on type MESFET's are used as transfer gates, this memory device can be driven under a single power supply and is operable at a high speed.

SUMMARY OF THE INVENTION

The object of the invention may be accomplished by providing a semiconductor memory device wherein a plurality of memory cells are connected in a matrix form by employing a plurality of bit lines and a plurality of word lines under a single power supply having one polarity terminal and a ground line, and a plurality of word line drivers are connected to the memory cells via the word lines and operable under the single power supply, each of those memory cells comprising:

a flip-flop including normally-on type gallium arsenide (GaAs) metal-semiconductor field effect transistors (MESFET's) as load MESFET's and normally-off type gallium arsenide (GaAs) metal-semiconductor field effect transistors (MESFET's) as driver MESFET's, drains of the load MESFET's being commonly connected to the one polarity terminal of the single power supply, sources of the driver MESFET's being commonly coupled to the ground line, and sources of the load MESFET's, and drains of the driver MESFET's being mutually connected to form nodes of the flip-flop;

transfer gates having normally-on type gallium arsenide (GaAs) metal-semiconductor field effect transistors (MESFET's), a source-to-drain current path of each of the transfer gate MESFET's being connected between the corresponding node and the corresponding bit line, and a gate electrode thereof being connected via the corresponding word line to the corresponding word line driver; and a parallel circuit including a diode and a switching gallium arsenide (GaAs) metal-semiconductor field effect transistor (MESFET), the parallel circuit being interposed between the commonly-connected sources of the driver MESFET's and the ground line in such a manner that a gate electrode of the switching GaAs-MESFET is connected via the corresponding word line to the corresponding word line driver, and a common potential of the commonly-connected sources of the driver MESFET's is equal to a forward voltage drop of the diode when the switching GaAs-MESFET is turned off while being driven by the corresponding word line driver via the corresponding word line.

BRIEF DESCRIPTION OF THE DRAWINGS

The invention will be best understood by reference to the accompanying drawings, in which.

DETAILED DESCRIPTION OF THE PREFERRED EMBODIMENTS

Arrangement of First Memory Device

Figure 2:
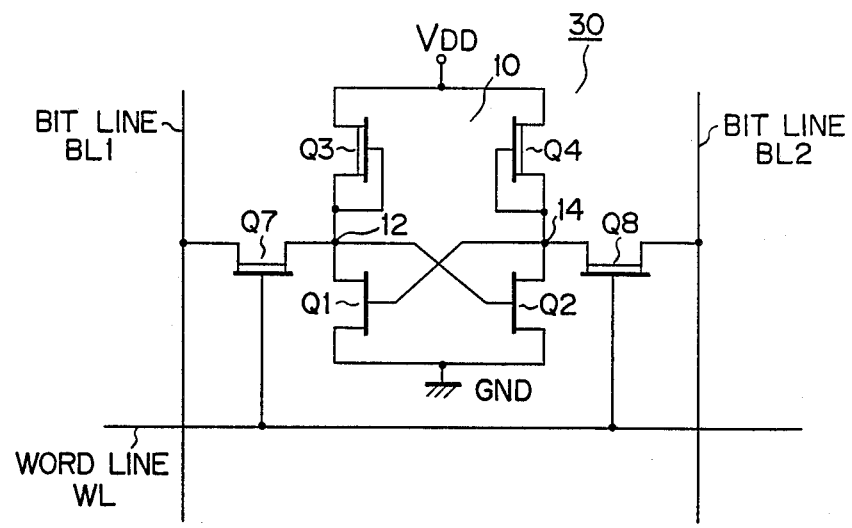
FIG. 2 is a simplified circuit diagram of the conventional memory cell including normally-on type MESFET's of transfer gates.
Figure 3:
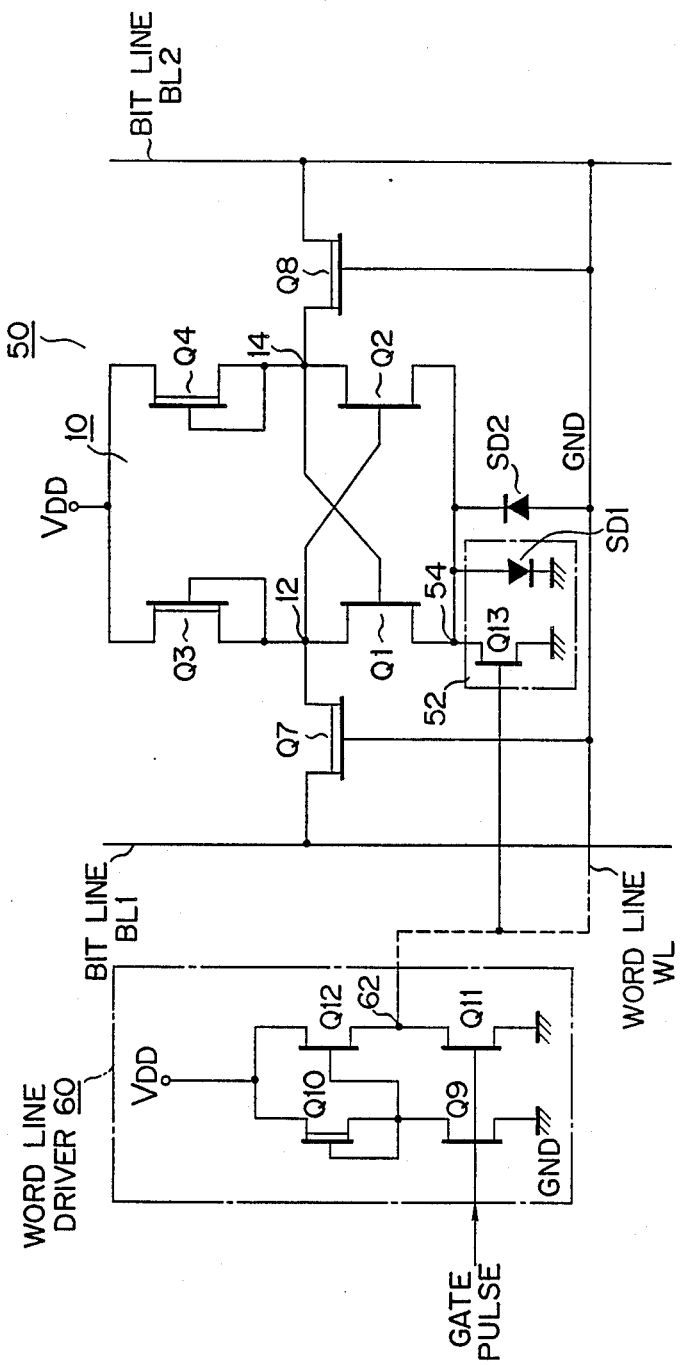
FIG. 3 is a schematic circuit diagram of a memory cell and its word line driver according to a first preferred embodiment.

FIG. 3 partially shows a first memory device comprising a basic memory cell 50 and a word line driver 60. Memory cell 50 fundamentally has the same arrangement, as that in FIG. 2 and the same parts, and elements as those in FIG. 2 are designated by the same reference numerals; therefore, the descriptions of the common portions are omitted. A different point between the circuits as shown in FIGS. 2 and 3 is that the sources of driver MESFET's $Q_1$ and $Q_2$ of memory cell 50 are commonly grounded through a parallel circuit 52 of a switching GaAs-MESFET $Q_{13}$ and a Schottky diode $SD_1$ which is manufactured by gallium arsenide (GaAs). Parallel circuit 52 is commonly provided for a plurality of memory cells (not shown in detail). A gate of switching MESFET $Q_{13}$ is connected to word line WL and selectively driven by an output of word line driver 60. A clamping Schottky diode $SD_2$ similarly manufactured by gallium arsenide (GaAs) is provided between the common source of $Q_1$ and $Q_2$ and word line WL.

The output stage of word line driver 60 is constituted by an E/E (enhancement/enhancement) type push-pull circuit of a single power supply $V_{DD}$. This E/E type push-pull circuit includes a normally-off type GaAs-MESFET $Q_{11}$ and a normally-off type GaAs-MESFET $Q_9$ functioned as a driver of an inverter, a normally-on type GaAs-MESFET $Q_{10}$ functioned as a load of the inverter, and a normally-off type GaAs-MESFET $Q_{12}$ driver by the output of the inverter.

Operation of First Memory Device

In this memory device, the potential of the common sources (i.e., the potential of a node 54) of MESFET's $Q_1$ and $Q_2$ of memory cell 50 is higher than the ground potential by only a potential level corresponding to one diode $SD_1$ (i.e., approximately 0.7 V) when word line WL is at a "Low" level. Namely, this voltage difference of 0.7 V corresponds to the value of the voltage drop in the forward direction of diode $SD_1$. Even when the value of a current flowing through diode $SD_1$ varies as well, this voltage difference remains at substantially 0.7 V.

When word line WL is at a "High" level, on the other hand, switching MESFET $Q_{13}$ is turned on, with the result that the potential of node 54 becomes substantially the ground potential. Thus, the potentials of the drains of $Q_1$ and $Q_2$, i.e., the potentials of nodes 12 and 14 of the flip-flop 10 have values within a range of 1.4 to 0.7 V when word line WL is at an "Low" level, whereas these potential values are within a range of 0.7 to 0 V when word line WL is at a "High" level.

Due to the clamping effect of clamping diode $SD_2$, the potential of the output stage of word line driver 60 (the drain potential of FET $Q_{11}$), i.e., the potential of word line WL changes within a range of 0 V (being not clamped) to 0.7 V (being clamped). As a result, when MESFET $Q_{11}$ at the output stage of driver 60 is turned on and thus, the potential of word line WL became 0 V (ground potential), this word line's potential is relatively equal to be negative with respect to the potential within a range of 0.7 to 1.4 V of nodes 12 and 14 of memory cell 50, so that transfer gate MESFET's $Q_7$ and $Q_8$ can be firmly turned off. Therefore, the information stored in memory cell 50 can be held. When MESFET $Q_{12}$ at the output stage of the word line driver 60 is turned on and then the potential of word line WL becomes 0.7 V, this word line voltage level become positive with respect to the node potential within a range of approximately 0.7 to 0 V of the memory cell. Thus, transfer gate MESFET's $Q_7$ and $Q_8$ are turned on and the information can be read out of memory cell 50 and also can be written into memory cell 50.

Overall operations of memory cell 50 and word line driver 60 in the first embodiment will now be summarized.

First, since word line driver 60 is arranged as a push-pull type inverter as mentioned above, MESFET $Q_{11}$ is turned on when word line driver 60 receives a gate pulse to enable MESFET $Q_{12}$ at the output stage of driver 60 to be turned off. Thus, the potential of a node 62 of this output stage becomes the ground level (0 V).

As a result, the potential of word line WL connected to this node 62 inevitably becomes 0 V (this level is specified as a "low" level in the specification). In this case, switching FET (although this is the MESFET, it is simply abbreviated to FET) $Q_{13}$ is turned off.

On the other hand, since Schottky diode $SD_1$ as the remaining element of parallel circuit 52 is forwardly biased, the voltage of about 0.7 V is produced across the diode $SD_1$. Therefore, the common source potential of FET's $Q_1$ and $Q_2$ of flip-flop 10, i.e., the potential of node 54 is held at about 0.7 V. Thus, the respective drain potentials of FET's $Q_1$ and $Q_2$, i.e., the potentials of nodes 12 and 14 of flip-flop 10 are from about 1.4 to 0.7 V.

Consequently, since the potential of word line WL is at a low level (0 V), it relatively acts as a negative potential with respect to the potentials within a range of 1.4 to 0.7 V of nodes 12 and 14. Thus, MESFET's $Q_7$ and $Q_8$ of the transfer gates can be turned off, since their gate electrodes are equivalently applied with negative biases. As the transfer gates $Q_7$ and $Q_8$ are turned off, the information stored in memory cell 50 can be held. That is, transfer gates $Q_7$ and $Q_8$ can be certainly turned off due to the operation of parallel circuit 52 connected between the common source electrodes of FET's $Q_1$ and $Q_2$ and the ground line, so that the information stored in memory cell 50 can be certainly held.

Next, when MESFET $Q_{11}$ at the output stage of word line driver 60 is inverted to the off-condition by the gate pulse, MESFET $Q_{12}$ connected to the drain of MESFET $Q_{11}$ is inverted to the on-condition. Thus, the potential of node 62 of the output stage of driver 60 tends to increase to $V_{DD}$. However, in the conventional case, when MESFET $Q_1$ of flip-flop 10 is in the on-state and certain information has been stored in cell 50, a predetermined current may flow from word line WL to the ground through transfer gate $Q_7$, MESFET $Q_1$ of flip-flop 10, and switching transistor $Q_{13}$ (this transistor is in the on-state since the voltage $V_{DD}$ is being applied). In this case, since the ON-resistance of FET $Q_1$ of flip-flop 10 is relatively large, the potential of node 12 on the side of the drain of FET $Q_1$ increases, so that there is a possibility that the information which should be inherently at a "low" level would be inverted (to a "high" level). Nevertheless, according to the feature of the invention, since clamping diode $SD_2$ is connected between word line WL and the common source electrodes of FET's $Q_1$ and $Q_2$ of flip-flop 10 in the direction as shown in the circuit diagram, a current different from the above current flows in the following way. That is to say, a predetermined current flows from $V_{DD}$ of word line driver 60 to the ground (GND) through FET $Q_{12}$, node 62, word line WL, clamping diode $SD_2$, and a source-to-drain current path of switching FET $Q_{13}$ of parallel circuit 52. Thus, the potential of word line WL is suppressed to a level not to $V_{DD}$, but below the raising voltage (up to 0.7 V) of this clamping diode $SD_2$ due to the clamping effect of clamping diode $SD_2$.

Thus, when the potential of word line WL becomes 0.7 V, it relatively functions as a positive potential for the potentials (approximately 0.7 to 0 V) of nodes 12 and 14 of memory cell 50. Therefore, transfer gates $Q_7$ and $Q_8$ can be turned on and the information can be normally read out from and written into memory cell 50.

In other words, the writing and reading operations of information into and from memory cell 50 are assured due to the clamping effect of clamping diode $SD_2$. On the other hand, the information stored in memory cell 50 is certainly held by parallel circuit 52 having the other clamping diode $SD_1$.

Second Memory Device

A second embodiment using the same word line driver as word line driver 60 of the first memory device shown in FIG. 3 will now be described with reference to FIG. 4.

Figure 4:
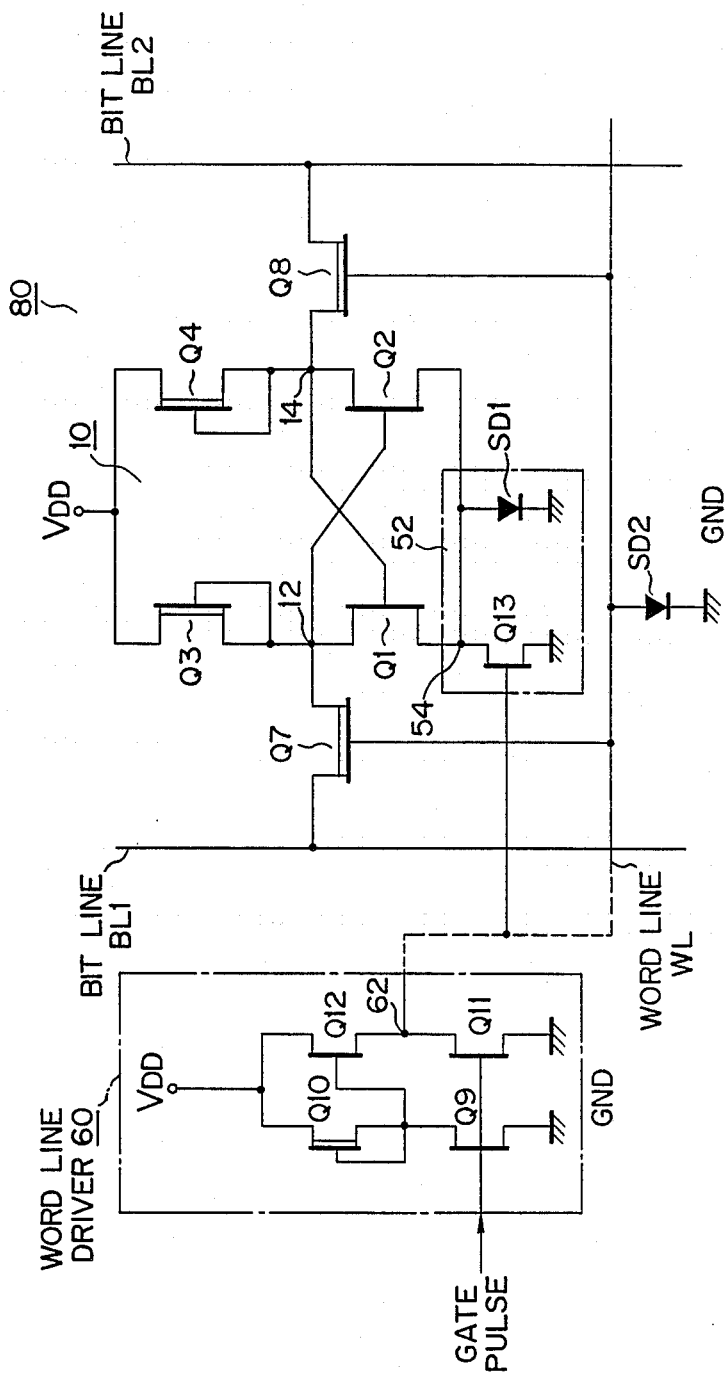
FIG. 4 is a schematic circuit diagram of a memory cell and its word line driver according to a second preferred embodiment.

As will be obvious from FIG. 4, although parallel circuit 52 constituted of switching MESFET $Q_{13}$ and diode $SD_1$ is identical to that of FIG. 3, this embodiment differs from that in FIG. 3 with respect to a connection of clamping diode $SD_2$ that is connected between word line WL and the ground (GND) in the direction shown in FIG. 4.

The operation of a memory cell 80 will now be described. Since parallel circuit 52 is connected in the same manner as memory cell 60 in FIG. 3, a further explanation is omitted with respect to the operation in the case where MESFET $Q_{12}$ of the output stage of word line driver 60 is in the off-state and MESFET $Q_{11}$ is in the on-state (namely, when the potential of word line WL is 0 V).

The operation when the gate pulse is received so as to turn on MESFET $Q_{12}$ of the output stage and simultaneously turn off MESFET $Q_{11}$ will now be described. While MESFET $Q_{12}$ is turned on and MESFET $Q_{11}$ is turned off, the potential of node 62 of driver 60 tends to increase to $V_{DD}$ in a manner similar to the above. However, word line WL connected to node 62 is essentially connected to the ground due to the conducting operation of clamping diode $SD_2$. Thus, the potential of this word line WL is suppressed to a lower level (about 0.7 V), as compared with $V_{DD}$, due to the clamping function of clamping diode $SD_2$. Therefore, the potential of word line WL can be considered as a relatively positive potential to the potentials (0.7 to 0 V) of nodes 12 and 14 of memory cell 80, with the result that transfer gates $Q_7$ and $Q_8$ can be surely turned on, thereby allowing the information to be normally read out from and written into memory cell 80.

Third Embodiment

Figure 5:
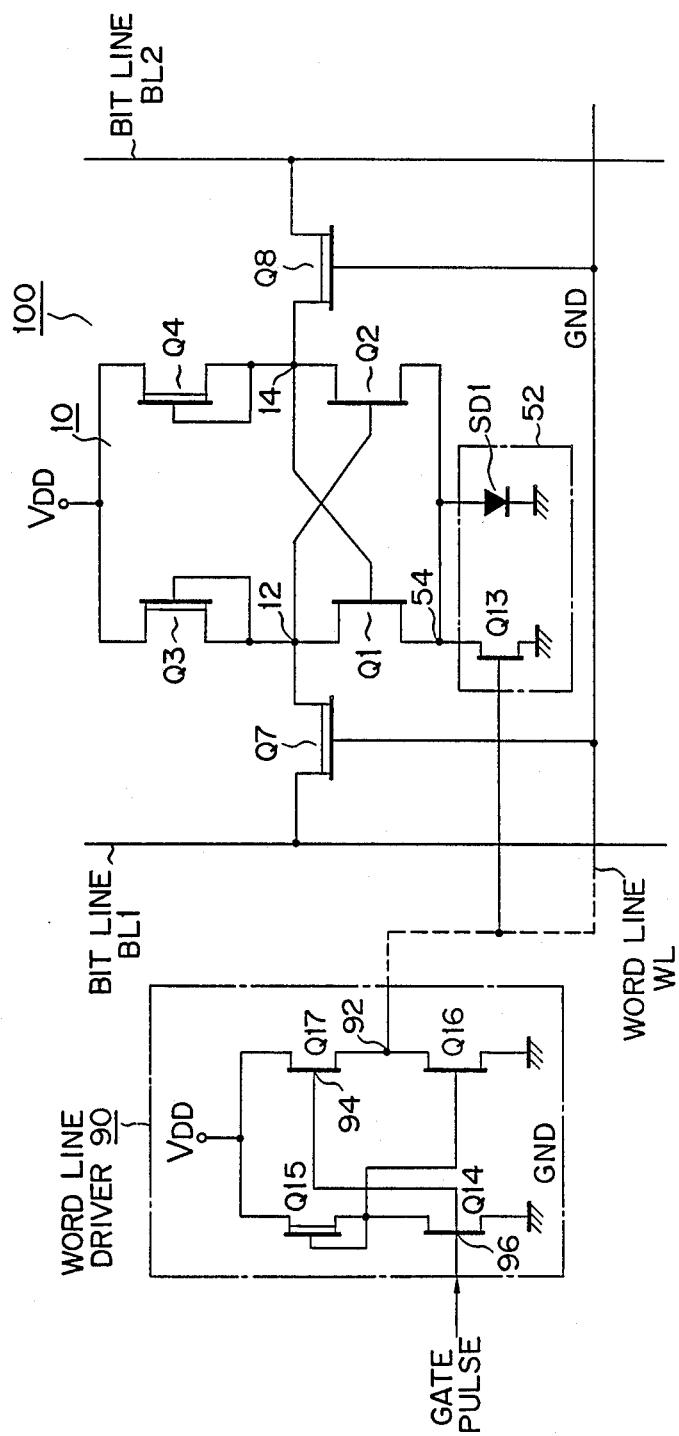
FIG. 5 is a schematic circuit diagram of a memory cell and its word line driver according to a third preferred embodiment.

A memory cell 100 of a third embodiment will now be described with reference to FIG. 5. The memory cell 100 of this third embodiment differs from memory cells 50 and 80 in the first and second embodiments with respect to the following circuits. First, clamping diode $SD_2$ is not provided. Moreover, a word line driver 90 is arranged as a push-pull type buffer circuit. MESFET's $Q_{14}$ to $Q_{16}$ different from MESFET's $Q_9$ to $Q_{11}$ constituting word line driver 60 in FIGS. 3 and 4 are provided for word line driver 90 in this push-pull type buffer circuit.

The operation of memory cell 100 will now be described. Since parallel circuit 52 is provided for memory cell 100 similarly to the first and second embodiments, in the case where MESFET $Q_{16}$ at the output stage of word line driver 90 is in the on-state and MESFET $Q_{17}$ is in the off-state, i.e., when the potential of word line WL is 0 V, memory cell 100 operates in substantially the same manner as in the first and second embodiments (i.e, holds the information); therefore, the explanation of the operation is omitted.

Accordingly, only the case where MESFET $Q_{17}$ is in the on-state and $Q_{16}$ is in the off-state will be explained. In this case, MESFET $Q_{17}$ is turned on while a gate pulse of a high level is applied to a gate electrode 94 of $Q_{17}$. Moreover, since this high-level gate pulse is also applied to a gate electrode 96 of MESFET $Q_{14}$, this MESFET $Q_{14}$ is also turned on. Since $Q_{14}$ is turned on, the potential of gate electrode 94 of MESFET $Q_{17}$ will not increase to a level above this clamping voltage (about 0.7 V) due to the clamping voltage between gate electrode 96 of $Q_{14}$ and the source thereof connected to the ground (GND) (i.e., the forward voltage drop of about 0.7 V of the diode formed between the gate electrode and the source). In order to turn on MESFET $Q_{17}$ by being applied with such a clamping voltage to gate electrode 94 of $Q_{17}$, the voltage between the gate electrode and the source of $Q_{17}$ needs to be above $V_{th}$ (threshold voltage) of FET $Q_{17}$. Thus, the potential of the source of FET $Q_{17}$, i.e., the voltage of 0.7 V - $V_{th}$ (in this case, $V_{th}$ is higher than 0 V since $Q_{17}$ is the normally-off type MESFET) is developed at a node 92. Namely, the potential more than 0.7 V will not be produced in word line WL. In other words, with such an arrangement of word line driver 90, the potential of word line WL is equivalently clamped below 0.7 V.

Such a clamping function will be described from another viewpoint. The potential of the gate electrode of MESFET $Q_{12}$ of word line driver 60 in FIGS. 3 and 4 is not clamped by MESFET $Q_9$ connected to FET $Q_{12}$, so that the voltage of ($V_{DD}-V_{th}$) higher than 0.7 V is produced in word line WL in the first and second embodiments. Therefore, in these previous embodiments, clamping diode $SD_2$ as shown in FIGS. 3 and 4 is necessarily needed.

As can be easily understood from the above description, according to the present invention, there is no need to provide clamping diode "$SD_2$" in dependence on the circuit arrangement of the word line driver.

The basic operation of the semiconductor memory device according to the present invention will be summarized hereinbelow.

In the case where the normally-off type MESFET's are used as transfer gates and this memory device is made operative by a single power supply, the reference potential of the memory cell, i.e., the common source potential (the potential of node 54) of MESFET's $Q_1$ and $Q_2$ of the flip-flop 10 can be dynamically changed with regard to the reference potential of word line driver as a peripheral circuit (the potential of node 62 or 92).

In more detail, there is provided a novel circuit which can turn off the normally-off type MESFET by applying to the transfer gate a substantially or relatively negative potential with respect to the reference potential of the memory cell.

ADVANTAGES OF THE INVENTION

According to the invention, the memory cell is certainly operable with the word line driver biased with the same single power supply $V_{DD}$ as that of memory cell. On the other hand, since the normally-on type MESFET can be used as a transfer gate, then the high speed memory operation can be realized.

Practical examples of designed data will now be explained. In FIG. 3, the ratio (W/L) of each gate width (W) to each gate length (L) of MESFET's $Q_7$ and $Q_8$ was set to 5/1. Likewise, the gate width-to-gate length ratio of MESFET's $Q_1$ and $Q_2$ was designed to be 10/1, the above-defined ratio of MESFET's $Q_3$ and $Q_4$ was set to be 4/8, and the above-defined ratio of MESFET $Q_{13}$ was set to be 500/1. The area of Schottky diode $SD_1$ was determined to be 20 $\mu$m $\times$ 20 $\mu$m. A static RAM of one kilobits was designed by use of those elements. When the power source voltage $V_{DD}$ is determined to be 2 V, the design value of 1.5 nsec as an access time was derived.

Figure 1:
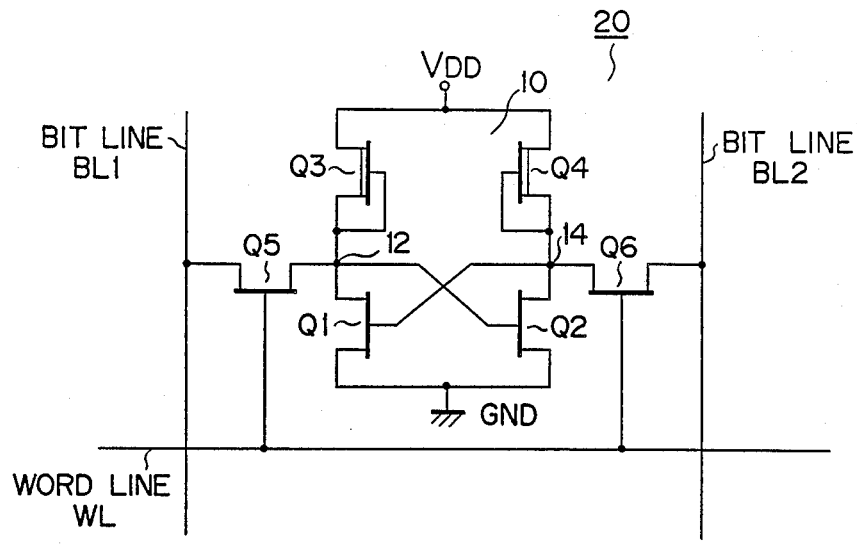
FIG. 1 is a simplified circuit diagram of the conventional memory cell including normally-off type MESFET's of transfer gates.

On the other hand, the 1kbit-RAM was similarly manufactured by use of the memory cell arrangement having transfer gates $Q_5$ and $Q_6$ of the normally-off type MESFET's in FIG. 1. Thus, the measured value of the access time was 3.0 nsec. As compared with the access time of this conventional RAM, the access time according to the embodiment was improved by about two times.

According to the invention, in addition, when the transfer gate is turned on, a high voltage level is obtained (as compared with that of the memory cell having the transfer gate constructed of the conventional normally-off type MESFET), so that the current drivability can be further improved.

Many variations and modifications of the present invention are possible without departing from the spirit and intended scope of the invention.

For example, silicon diode and Zener diode can be also used in place of Schottky diodes $SD_1$ and $SD_2$ of GaAs. In brief, any element may be employed if it can maintain the voltage across this element substantially constant even if a forward current changes as well.

What is claimed is:

1. A semiconductor memory device wherein a plurality of memory cells are connected in a matrix form by employing a plurality of bit lines and a plurality of word lines under a single power supply having one polarity terminal and a ground line, and a plurality of word lines drivers are connected to said memory cells via said word lines and operable under said single power supply, each of said memory cells comprising:
    a flip-flop including normally-on type gallium arsenide (GaAs) metal-semiconductor field effect transistors (MESFET's) as load MESfet's and normally-off type gallium arsenide (GaAs) metal-semiconductor field effect transistors (MESFET's) as driver MESFET's, drains of said load MESFET's being commonly connected to said one polarity terminal of the single power supply, sources of said driver MESFET's being commonly coupled to said ground line, and sources of said load MESFET's and drains of said driver MESFET's being mutually connected to form nodes of the flip-flop;
    transfer gates having normally-on type gallium arsenide (GaAs) metal-semiconductor field effect transistors (MESFET's), a source-to-drain current path of each of said transfer gate MESFET's being connected between the corresponding one of said nodes and the corresponding one of said bit line, and a gate electrode thereof being connected via the corresponding one of said word line to the corresponding one of said word line drivers; and
    a parallel circuit including a diode and a switching gallium arsenide (GaAs) metal-semiconductor field effect transistor (MESFET), said parallel circuit being connected in parallel between said sources of said driver MESFET's and said ground line in such a manner that a gate electrode of said switching GaAs-MESFET is connected via said corresponding word line to said corresponding word line driver, and a potential of said sources of the driver MESFET's is equal to a forward voltage drop of said diode when said switching GaAs-MESFET is turned off while being driven by said corresponding word line driver via said corresponding word line.

2. A semiconductor memory device as claimed in claim 1, wherein each of said word line drivers is constructed by a push-pull type buffer circuit including at least four gallium arsenide (GaAs) metal-semiconductor field effect transistors (MESFET's), a potential of an output stage of said word line driver being clamped by the clamping effect of a gate-to-source path of the GaAs-MESFET when said switching GaAs-MESFET is turned off under control of said corresponding word line driver.

3. A semiconductor memory device as claimed in claim 1, wherein each of said word line drivers is constructed by a push-pull type inverter circuit including at least four-gallium arsenide (GaAs) metal-semiconductor field effect transistors (MESFET's), and a clamping diode is interposed between said commonly-connected sources of the driver MESFET's and said corresponding word line in such a manner that a potential of an output stage of said word line driver is clamped by the clamping effect of said clamping diode when said switching GaAs-MESFET is turned off under control of said corresponding word line driver.

4. A semiconductor memory device as claimed in claim 3, wherein said clamping diode is a gallium arsenide Schottky diode.

5. A semiconductor memory device as claimed in claim 1, wherein each of said word line drivers is constructed by a push-pull type inverter circuit including at least four gallium arsenide (GaAs) metal-semiconductor field effect transistors (MESFET's), and a clamping diode is interposed between said corresponding word line and the ground line in such a manner that a potential of an output stage of said word line driver is clamped by the clamping effect of said clamping diode when said switching GaAs-MESFET is turned off under control of said corresponding word line driver.

6. A semiconductor memory device as claimed in claim 5, wherein said clamping diode is a gallium arsenide Schottky diode.

7. A semiconductor memory device as claimed in claim 1, wherein said diode of the parallel circuit is a gallium arsenide Schottky diode.

8. A semiconductor memory device as claimed in claim 1, wherein said semiconductor memory device is a static random access memory.

* * * * *